(12) United States Patent
Song et al.

(10) Patent No.: US 9,502,374 B2
(45) Date of Patent: Nov. 22, 2016

(54) AUTOMATIC WIRE TAIL ADJUSTMENT SYSTEM FOR WIRE BONDERS

(71) Applicants: Keng Yew Song, Singapore (SG); Wai Wah Lee, Singapore (SG); Yi Bin Wang, Singapore (SG); Wen Hua Guo, Singapore (SG); Xin Wei Zhang, Singapore (SG)

(72) Inventors: Keng Yew Song, Singapore (SG); Wai Wah Lee, Singapore (SG); Yi Bin Wang, Singapore (SG); Wen Hua Guo, Singapore (SG); Xin Wei Zhang, Singapore (SG)

(73) Assignee: ASM TECHNOLOGY SINGAPORE PTE LTD., Singapore (SG)

( * ) Notice: Subject to any disclaimer, the term of this patent is extended or adjusted under 35 U.S.C. 154(b) by 657 days.

(21) Appl. No.: 13/658,957

(22) Filed: Oct. 24, 2012

(65) Prior Publication Data

US 2013/0098877 A1    Apr. 25, 2013

Related U.S. Application Data

(60) Provisional application No. 61/550,996, filed on Oct. 25, 2011.

(51) Int. Cl.
*H01L 23/00* (2006.01)
*B23K 35/02* (2006.01)
*B23K 20/00* (2006.01)

(52) U.S. Cl.
CPC ............ *H01L 24/78* (2013.01); *B23K 20/007* (2013.01); *B23K 35/0261* (2013.01); *H01L 24/85* (2013.01); *H01L 24/45* (2013.01); *H01L 2224/45144* (2013.01); *H01L 2224/45147* (2013.01); *H01L 2224/48477* (2013.01); *H01L 2224/78301* (2013.01); *H01L 2224/78611* (2013.01); *H01L 2224/78621* (2013.01); *H01L 2224/85045* (2013.01); *H01L 2224/85051* (2013.01); *H01L 2224/85205* (2013.01)

(58) Field of Classification Search
CPC .......... B23H 1/00; B23H 7/26; B23H 11/00; H01L 24/78; H01L 21/00; H01L 24/85; H01L 2224/78301
USPC .................. 219/69.11, 85.18; 228/180.5, 4.5
See application file for complete search history.

(56) References Cited

U.S. PATENT DOCUMENTS

| 5,176,310 | A  | * | 1/1993 | Akiyama et al. | .......... 228/180.5 |
| 2001/0004991 | A1 | * | 6/2001 | Mochida et al. | ............. 228/103 |
| 2009/0014858 | A1 | * | 1/2009 | Boon et al. | .................. 257/686 |
| 2010/0065963 | A1 | * | 3/2010 | Eldridge et al. | ............. 257/734 |

* cited by examiner

*Primary Examiner* — Dana Ross
*Assistant Examiner* — Kuangyue Chen
(74) *Attorney, Agent, or Firm* — Ostrolenk Faber LLP

(57) ABSTRACT

A capillary is utilized to form the wedge wire bond comprised in a wire interconnection. A wire holding device is located above a wire clamp and the capillary to secure the wire while the wire clamp is open and not clamping onto the wire. The wire clamp and the capillary may be lifted relative to the wire in a direction away from the wedge wire bond and towards the wire holding device so as to pay out a length of wire from the capillary. At a predetermined height of the capillary, the wire clamp is closed to clamp onto the wire, and thereafter, the capillary and wire clamp may be moved further away from the wedge wire bond to cause the wire to break away from the wedge wire bond and to form the wire tail with a desired length extending from the capillary.

13 Claims, 4 Drawing Sheets

AUTOMATIC WIRE TAIL ADJUSTMENT SYSTEM FOR WIRE BONDERS

FIELD OF THE INVENTION

The invention relates to wire bonders, and in particular to a wire-feeding system for wire bonders.

BACKGROUND AND PRIOR ART

Wire bonders are used during semiconductor assembly and packaging for making electrical wire connections between electrical contact pads on a semiconductor chip and a substrate, or between electrical contact pads on different semiconductor chips. Wire is fed from a wire spool containing bonding wire to a bonding tool such as a capillary for performing wire bonding at the bonding tool. The most widely used wire materials are gold, copper and aluminum. The electrical contact pads may comprise metallized bond sites on the semiconductor chip and on the interconnection substrates.

A typical method used to bond or weld the wire to a connection pad is through a combination of heat, pressure and/or ultrasonic energy. It is a solid phase welding process, wherein the two metallic materials (the wire and the pad surface) are brought into intimate contact. Once the surfaces are in intimate contact, electron sharing or interdiffusion of atoms takes place, resulting in the formation of a wire bond. The bonding force can lead to material deformation, breaking up of a contamination layer and smoothing out of surface asperity, which can be enhanced by the application of ultrasonic energy. Heat can accelerate inter-atomic diffusion, thus forming the wire bond.

One type of wire bond formation uses a ball wire bond. The process involves melting a sphere of wire material on a length of wire held by a capillary, which is lowered and welded to a first bonding position. The capillary then draws out a loop and then connects the wire to a second bond position using a bond that is usually of a crescent shape, commonly called a wedge wire bond. Another ball is then reformed for a subsequent first ball wire bond. Currently, gold or copper ball bonding is the most widely used bonding technique. Its advantage is that once the ball wire bond is made on the connection pad of a device, the wire may be moved in any direction without stress on the wire, which greatly facilitates automatic wire bonding.

During ball bonding operations, the second bond is in the form of the wedge wire bond at the second bond position. After the wedge formation, the bond head will move upwards when the wire is still connected to the wedge wire bond such that a length of wire is paid out between the capillary and the wedge wire bond. The bond head will rise to a tail height position, whereat a wire clamp of the wire bonding apparatus will close as the bond head moves to an Electric Flame-Off ("EFO") level. During the further upwards motion when the wire clamp is closed, the wire will break off at the wedge wire bond location, thereby forming a wire tail which extends freely out of the capillary. An EFO device will produce a spark to melt the wire tail to produce a molten ball, which is used for forming the next ball wire bond.

The wire tail has to be of a sufficient length in order to produce a proper molten ball for the next ball bond. However, the wire tail may be too short or be missing due to various reasons. For instance, if the bonding parameters for the wedge formation are not well optimized or the material being bonded is contaminated, the wire may break off from the wedge wire bond prematurely. The wire may then unexpectedly fly out from the wire path or the capillary itself. If there is a short tail or no tail at all, a molten ball cannot be properly produced to make the next ball bond. If the apparatus detects that a proper wire tail is not formed indicating an operational error, the machine will stop and manual intervention by a human operator is generally required such as to rethread the bonding wire through the capillary. Accordingly, such errors in the formation of the wire tail lead to unnecessary machine downtime and reduce productivity.

SUMMARY OF THE INVENTION

It is therefore an object of the invention to seek to automatically prevent and/or recover from an inadequate wire tail extending from a capillary during wire bonding operations to reduce human intervention and to increase productivity of a wire bonding apparatus.

It is a related object of the invention to seek to measure a wire tail extending from a capillary to ensure that it is of an appropriate length to facilitate subsequent wire bonding operations.

Accordingly, the invention provides a wire bonding method for forming a wire interconnection including a wedge wire bond, the method comprising the steps of: using a capillary to form the wedge wire bond; using a wire holding device located above a wire clamp and the capillary to secure the wire while the wire clamp is open and not clamping onto the wire; lifting the wire clamp and the capillary relative to the wire in a direction away from the wedge wire bond and towards the wire holding device so as to pay out a length of wire from the capillary; at a predetermined height of the capillary, closing the wire clamp to clamp onto the wire; and thereafter moving the capillary and wire clamp further away from the wedge wire bond to cause the wire to break away from the wedge wire bond so as to form the wire tail with a desired length extending from the capillary.

It will be convenient to hereinafter describe the invention in greater detail by reference to the accompanying drawings which illustrate one embodiment of the invention. The particularity of the drawings and the related description is not to be understood as superseding the generality of the broad identification of the invention as defined by the claims.

BRIEF DESCRIPTION OF THE DRAWINGS

An example of a preferred embodiment of a wire bonding apparatus and method in accordance with the invention will now be described with reference to the accompanying drawings, in which.

DETAILED DESCRIPTION OF THE PREFERRED EMBODIMENT OF THE INVENTION

Figure 1:
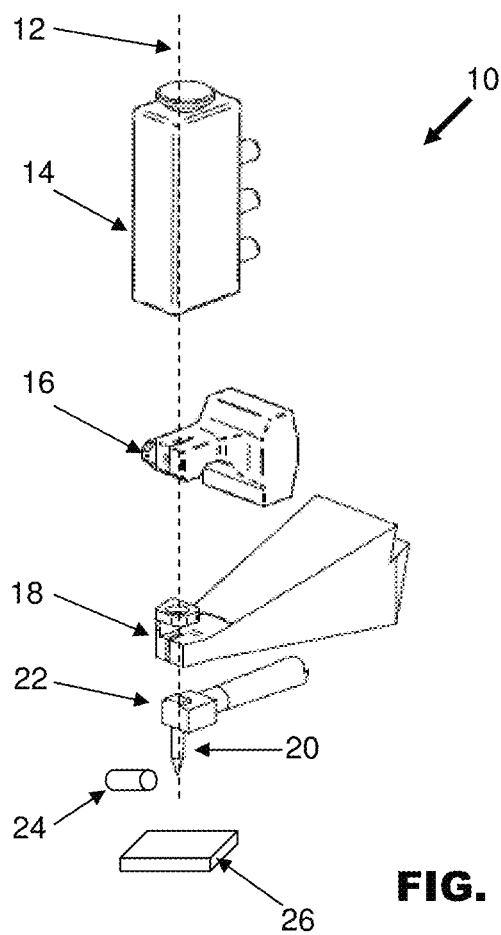
FIG. 1 is a perspective view of a wire bonding apparatus according to the preferred embodiment of the invention.

FIG. 1 is a perspective view of a wire bonding apparatus 10 according to the preferred embodiment of the invention. Bonding wire 12, such as gold or copper wire, is fed from a wire spool (not shown) into a pneumatic device 14 which is operative to apply vertical vacuum suction forces upwards or downwards to urge movement of the bonding wire 12 in these directions. A wire holding device 16, which may be in the form of a wire clamp, is located below the pneumatic device 14 and is operative to secure the bonding wire 12 and to control the movement of bonding wire 12 along the wire feeding route. The wire holding device 16 may also comprise a solenoid energizing mechanism, pneumatic mechanism or any other mechanism that may serve the function of providing a holding force to hold the wire in position during wire bonding.

A wire clamp 18 is located below the wire holding device 16 to clamp onto the bonding wire 12 when relative movement of the bonding wire 12 is to be restrained or movement of the bonding wire being fed is to be controlled. The wire holding device 16 is operable separately from the wire clamp 18. The bonding wire 12 is then passed through a capillary 20 underneath the wire clamp 18. The capillary 20 is generally located at one end of a transducer horn 22. Wire bonding is conducted at a bottom tip of the capillary 20. Typically, ball wire bonds and wedge wire bonds may be formed by the capillary 20.

An Electronic Flame-Off ("EFO") torch 24 is located next to the bottom tip of the capillary 20 to provide electrical sparks to melt a tail end of the bonding wire 12 for the purpose of wire bonding. The tail end of the bonding wire 12 is also referred to as a wire tail. Molten bonding wire 12 is in the form of a ball which is then bonded onto an electronic device 26 by the capillary 20 to create a first bond of a wire interconnection. The first bond is preferably a ball wire bond. The capillary 20 then extends the bonding wire 12 to form a wire loop extending from the first bond. Thereafter, a second bond in the form of a wedge wire bond is made by the capillary 20 at a second bonding position to complete a wire interconnection between the first and second bonding positions.

Figure 2:
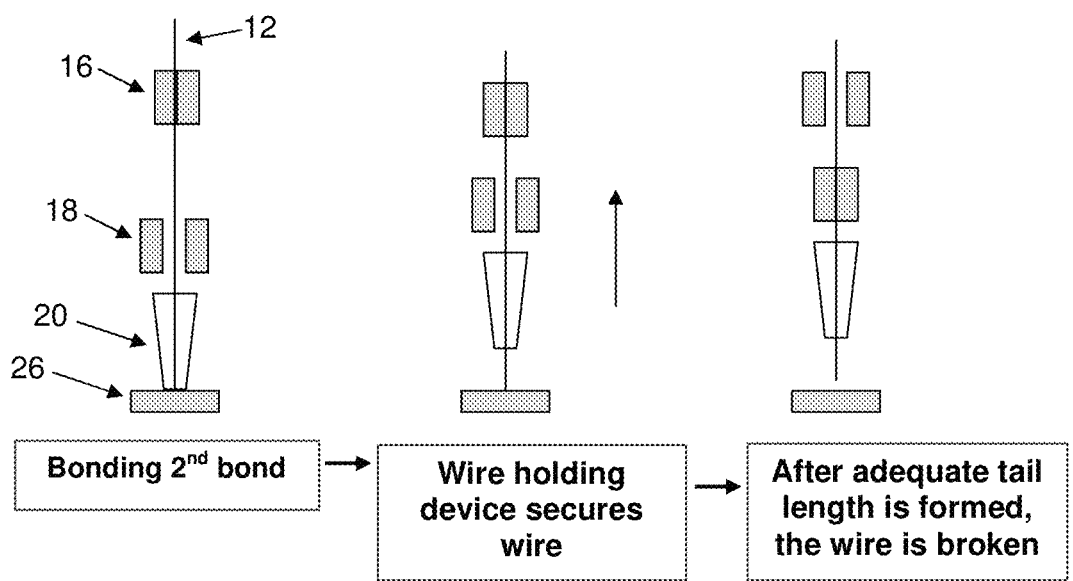
FIG. 2 is a schematic illustration of how a length of bonding wire may be controlled to reduce the likelihood of occurrence of a short wire tail.

FIG. 2 is a schematic illustration of how a length of bonding wire 12 may be controlled to reduce the likelihood of occurrence of a short wire tail. At the second bonding position, the capillary 20 is in contact with the electronic device 26 when creating a wedge wire bond. At this time, the wire holding device 16 is closed to secure the bonding wire 12, and the wire clamp 18 is open so as not to clamp onto the bonding wire 12. After the wedge wire bond has been created, the capillary 20 is lifted and moves upwards together with the wire clamp 18 relative to the bonding wire 12 in a direction away from the wedge wire bond and towards the wire holding device 16 to pay out a length of wire from the wedge wire bond when the wire is still connected to the wedge wire bond. This action extends a sufficient length of bonding wire 12 to create a wire tail.

When the capillary 20 and wire clamp 18 are moving upwards to pay out wire from the capillary 20, the wire holding device 16 should clamp onto the bonding wire 12 to secure the bonding wire 12 and control its position so that in case the bonding wire 12 breaks prematurely from the wedge bond, the bonding wire 12 does not deflect from the wire feeding route. The said control of the bonding wire position would reduce the likelihood of deviation of the bonding wire 12 from the wire feeding route and avoid unnecessary machine stoppage.

After the capillary 20 has risen to a predetermined height and an adequate wire tail length is formed, the wire clamp 18 closes onto the bonding wire 12 whereas the wire holding device 16 can now be opened. Upon further upward motion of the capillary 20 and wire clamp 18 away from the wedge wire bond, the wire tail of a desired length breaks away from the wedge wire bond on the electronic device 26. The wire tail with a desired length extending from the capillary 20 is now ready to be melted by the EFO device 24 to form a ball for creating the next ball wire bond.

Figure 3:
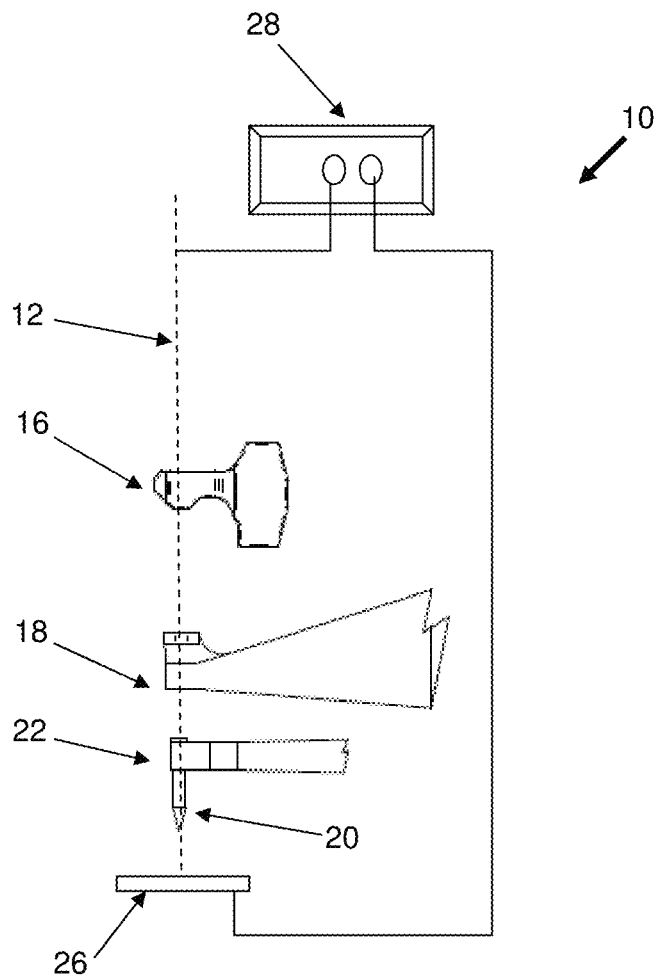
FIG. 3 is a side view of the wire bonding apparatus of FIG. 1 illustrating a wire tail length measurement system according to the preferred embodiment of the invention.

FIG. 3 is a side view of the wire bonding apparatus 10 of FIG. 1 illustrating a wire tail length measurement system according to the preferred embodiment of the invention. Wire tail length measurement is very useful when a short tail is discovered and the wire bonding apparatus 10 needs to automatically determine how much bonding wire 12 to pay out in order to obtain a wire tail of an adequate length to continue a wire bonding operation without operator intervention.

A contact detection device 28 is used in association with the wire bonding apparatus 10 to detect a length of the wire tail. When a possible short tail or missing tail is discovered by the system, typically when the wire bonding apparatus 10 detects that the bonding wire 12 had broken off from the second or wedge bond prematurely, the length of the wire tail that remains should be determined. To do this, one electrode of the contact detection device 28 is electrically connected to the bonding wire 12 whilst another electrode of the contact detection device 28 is electrically connected to the electronic device 26 or some other electrically-conductive surface. Alternatively, any other suitable electrical sensor may be electrically connected to the bonding wire 12 and to the electrically-conductive surface respectively for detecting contact between the bonding wire 12 and the electrically-conductive surface. These connections form an electrical circuit loop. The said circuit loop is open when the bonding wire 12 is not in contact with the electronic device 26 or some other electrically-conductive surface, and is closed when the bonding wire 12 is in contact with the same.

At this point, some of the tail portion of the bonding wire 12 may be hanging freely from the tip of the capillary 20 such that the circuit loop of the contact detection device 28 is open. The capillary 20 holding the bonding wire 12 is then positioned at a predetermined height, and is gradually lowered towards the electronic device 26 while the vertical position of the capillary 20 or other suitable part of the bond head is being monitored. The capillary 20 is lowered until the bonding wire 12 first contacts the electronic device 26 or other electrically-conductive surface, whereupon the circuit loop of the contact detection device 28 would be closed. At this point, the vertical position of the capillary 20 or other relative point on the bond head is noted. Since a height of the electronic device 26 or other electrically-conductive surface is known, the length of the bonding wire 12 protruding from the tip of the capillary 20 can be determined.

Once the length of the protruding bonding wire 12 is determined, the system can calculate an additional length of the bonding wire that needs to be paid out (or retracted) in order to obtain the desired wire tail length to continue further bonding operations without operator intervention. After a desired wire tail length has been obtained or if the wire tail length is within a predetermined range, a spark from the EFO device 24 melts an end of the wire tail to produce a molten ball so as to make a subsequent wire bond.

Figure 4:
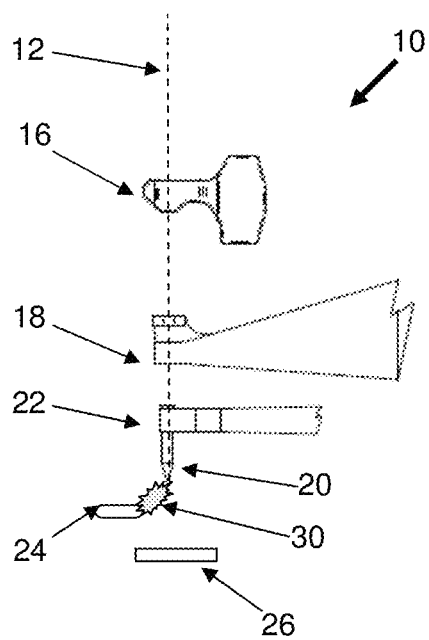
FIG. 4 is a side view of the wire bonding apparatus of FIG. 1 illustrating a first method of releasing a length of wire that is stuck onto the capillary.

In certain instances, the bonding wire 12 may be stuck to the capillary 20 such that it cannot be further paid out despite maneuvering the wire clamp 18 relative to the bonding wire 12. FIG. 4 is a side view of the wire bonding apparatus of FIG. 1 illustrating a first method of releasing a length of bonding wire that is stuck onto the capillary 20, typically at the tip of the capillary 20. In this first method, the tip of the capillary 20 is moved adjacent to the EFO device 24. One or more sparks 30 are then produced from the EFO device 24 onto the bonding wire 12 in order to melt the part of the bonding wire 12 that is stuck to the tip of the capillary 20. After the bonding wire 12 melts, it becomes unstuck and may be detached from the capillary 20 such that bonding wire 12 may be paid out and wire bonding operations may continue.

Figure 5:
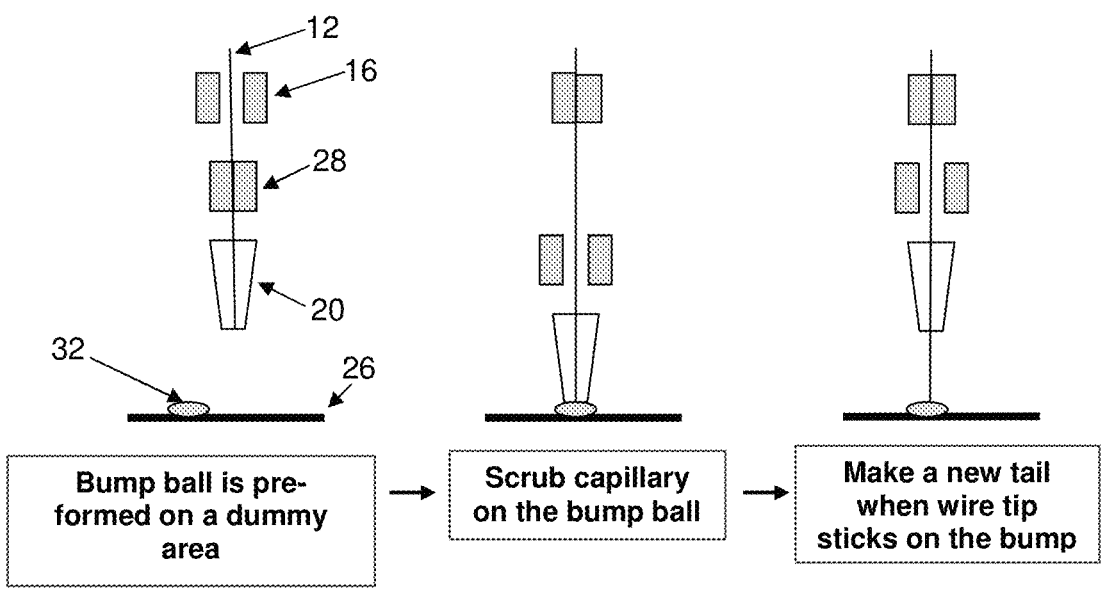
FIG. 5 is a schematic illustration of a second method of releasing a length of wire that is stuck onto the capillary.

FIG. 5 is a schematic illustration of a second method of releasing a length of bonding wire that is stuck onto the capillary 20. In this method, a bump ball 32 in the form of a ball wire bond is already pre-formed by pre-bonding it on a dummy area or surface, which could be located on an unused portion of the electronic device 26 or some other surface. If it is determined that the bonding wire 12 is stuck onto the tip of the capillary 20, the capillary 20 brings the bonding wire 12 towards the bump ball 32 and the capillary 20 is positioned on top of the bump ball 32. The capillary 20 then attempts to bond and attach the stuck bonding wire 12 to the bump ball 32, such as by a scrubbing action through ultrasonic vibration, so that the stuck wire is separated from the capillary 20.

When the tip of the bonding wire 12 is sticking onto the bump ball 32, the capillary 20 is lifted while the wire clamp 18 is open to create a new wire tail. Once a wire tail of an adequate length is obtained, the wire clamp 18 is closed. Upon further lifting of the capillary 20 and wire clamp 18, the wire tail breaks off from the bump ball 32 and a new wire tail of the desired length will be available for further bonding operations.

Figure 6:
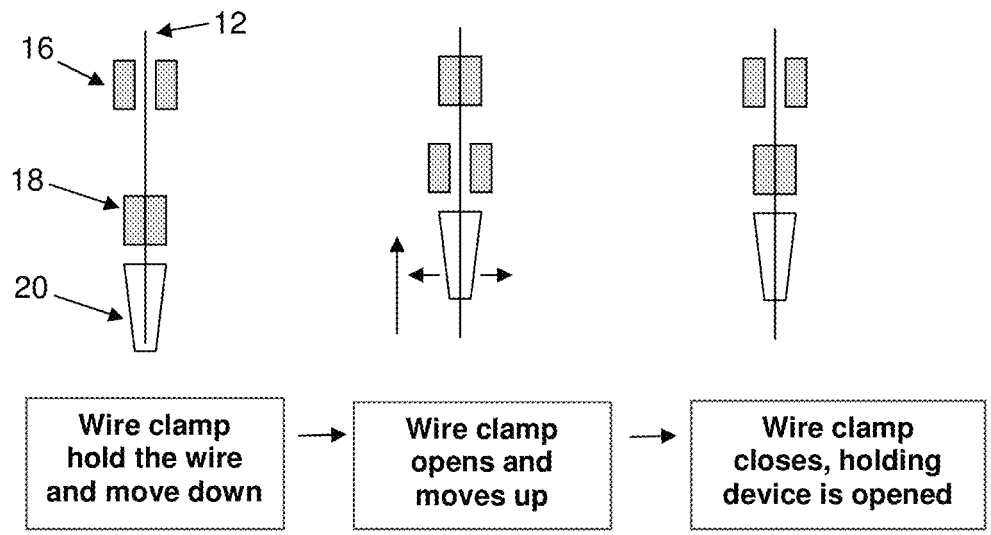
FIG. 6 is a schematic illustration of the paying-out of bonding wire to an appropriate tail length for subsequent wire bonding operations.

FIG. 6 is a schematic illustration of the paying-out of bonding wire 12 to an appropriate tail length for subsequent wire bonding operations. Once a length of the tail wire has been determined, the wire bonding apparatus 10 will know how much bonding wire 12 needs to be paid out in order to arrive at the desired length. To pay out bonding wire 12, the wire clamp 18 will first clamp onto the bonding wire 12 while the wire holding device 16 is open and the bonding wire 12 is released from being secured by the wire holding device 16. The wire clamp 18 will then pull the bonding wire 12 downwards in a direction away from the wire holding device 16 and towards the capillary 20 so that more bonding wire 12 is fed from the wire spool. Thereafter, the wire holding device 16 closes onto the bonding wire 12 to prevent movement by the bonding wire 12, and the wire clamp 18 is opened. The wire clamp 18 will then move upwards towards the wire holding device 16 to prepare for another pulling action. After the wire clamp 18 has been raised relative to the bonding wire 12, it closes onto the bonding wire 12 again and then the wire holding device 16 is opened to release the bonding wire 12 from being secured. The wire clamp 18 pulls the bonding wire 12 downwards again away from the wire holding device 16 and towards the capillary 20 until the correct wire tail length is reached. If not, the cycle may be repeated to pay out more bonding wire 12.

Figure 7:
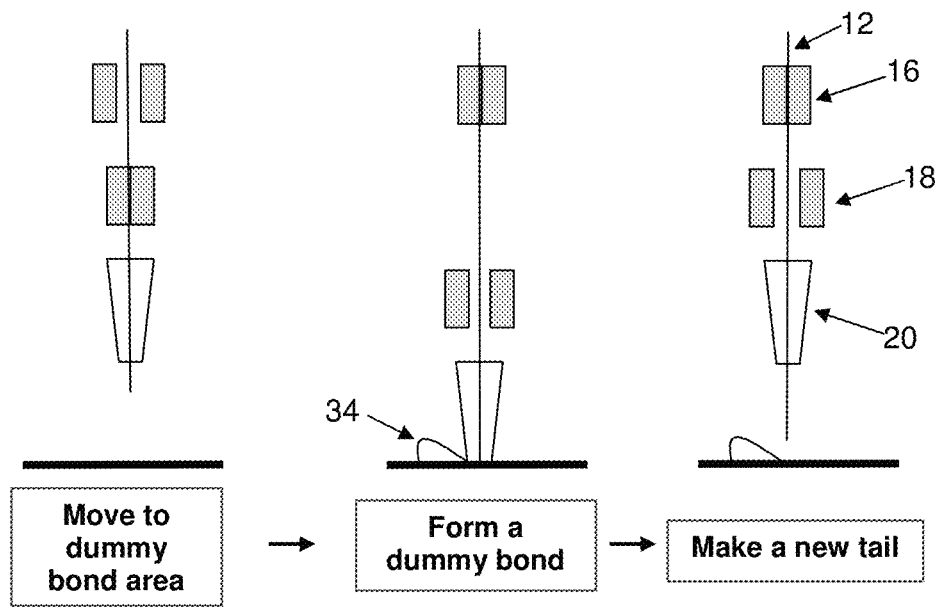
FIG. 7 is a schematic illustration of how a new tail may be created in case a correct wire tail length cannot be properly paid out.

FIG. 7 is a schematic illustration of how a new tail may be created in case a correct wire tail length cannot be properly paid out. After attempts to adjust a length of the wire tail have been made, the correct tail length may still not be achieved, or a shape of the wire tail may be deformed by the sparks 30 produced to detach a stuck bonding wire 12 from the capillary 20. If so, it may be necessary to remove a defective wire tail and to form a new wire tail to ensure smooth continuation of the bonding operations. In this case, a dummy bond may be created.

The capillary 20 is first moved to a dummy area, which may be on an unused portion of the electronic device 26 or some other surface. The EFO device 24 produces a spark to melt the wire tail and form a molten ball. A first, ball wire bond is then created on the dummy area. Thereafter, the capillary 20 moves upwards and extends the bonding wire 12 towards a second bonding position to create a second, wedge wire bond. In the process, a wire loop 34 is formed. After the wire loop 34 has been formed, the bonding wire 12 is broken off from the wedge bond and a new wire tail of a desired length extending from the capillary 20 is formed. Wire bonding operations can then continue more smoothly.

Alternatively, instead of forming a wire loop 34, a bump ball 32 may be created and after bonding wire 12 has been extended from the bump ball 32, the bonding wire 12 can be immediately broken off from the bump ball 32 to form a new wire tail of a desired length extending from the capillary 20 as shown in FIG. 5. In this way, there can be savings in bonding time, or sometimes, make it easier to detach a stuck wire. However, in this case, the ball bump must be bonded strongly enough so that it is not dislodged from the dummy area when the bonding wire 12 is being pulled to break it off from the ball wire bond.

The invention described herein is susceptible to variations, modifications and/or additions other than those specifically described and it is to be understood that the invention includes all such variations, modifications and/or additions which fall within the spirit and scope of the above description.

The invention claimed is:

1. A wire bonding method for forming a wire interconnection including a wedge wire bond, the method comprising steps in the following sequence:
    forming the wedge wire bond on a wire using a capillary;
    securing, using a wire holding device located above a wire clamp and the capillary, the wire while the wire clamp is open and not clamping onto the wire; thereafter,
    lifting the wire clamp and the capillary relative to the wire in a direction away from the wedge wire bond and towards the wire holding device so as to pay out a length of wire from the capillary;
    at a predetermined height of the capillary, closing the wire clamp to clamp onto the wire; and thereafter
    moving the capillary and wire clamp further away from the wedge wire bond to cause the wire to break away from the wedge wire bond so as to form the wire tail with a desired length extending from the capillary.

2. The wire bonding method as claimed in claim 1, further comprising the step of releasing the wire from being secured by the wire holding device after the wire clamp is closed.

3. The wire bonding method as claimed in claim 1, further comprising the steps of:
    after the formation of the wire tail, positioning the capillary at a predetermined height and gradually lowering the wire tail towards an electrically-conductive surface;

determining a length of the wire tail extending from the capillary; and thereafter creating a spark to melt an end of the wire tail to produce a molten ball so as to make a subsequent wire bond.

4. The wire bonding method as claimed in claim 3, wherein the step of determining the length of the wire tail extending from the capillary further comprises the step of using a contact detection device to detect a vertical position at which the wire tail contacts the electrically-conductive surface, and determining a length of the wire tail based upon the said vertical position at which the wire tail contacts the electrically-conductive surface.

5. The wire bonding method as claimed in claim 4, wherein the contact detection device comprises a first electrode which is electrically connected to the wire and a second electrode which is electrically connected to the electrically-conductive surface.

6. The wire bonding method as claimed in claim 3, wherein the step of determining the length of the wire tail extending from the capillary further comprises the steps of:

connecting an electrical sensor to the wire and to the electrically-conductive surface respectively to form a circuit loop, wherein the circuit loop is open when the wire is not in contact with the electrically-conductive surface and is closed with the wire is in contact with the electrically-conductive surface;

moving the capillary gradually towards the electrically-conductive surface until the wire contacts the electrically-conductive surface to close the circuit loop; and thereafter determining the length of the wire tail extending from a tip of the capillary to the electrically-conductive surface at a vertical position of the capillary when the circuit loop is closed.

7. The wire bonding method as claimed in claim 1, further comprising the step of paying out an additional length of wire from the capillary, which comprises the steps of:

releasing the wire from being secured by the wire holding device;

pulling the wire with the wire clamp in a direction away from the wire holding device and towards the capillary;

using the wire holding device to secure the wire;

moving the capillary and wire clamp relative to the wire in a direction towards the wire holding device after the wire clamp is opened to pay out wire from the capillary; and thereafter clamping the wire with the wire clamp and releasing the wire from being secured by the wire holding device.

8. The method as claimed in claim 1, wherein the method further comprises:

producing one or more electrical sparks onto a part of the wire which is stuck on a surface of the capillary to melt the wire which is stuck on the surface of the capillary and detaching the melted wire tail from the surface of the capillary.

9. The method as claimed in claim 1, wherein the method further comprises:

positioning, stuck wire that is stuck to the capillary, onto a ball which has been pre-bonded on a surface, attaching the stuck wire to the ball and separating the stuck wire from the capillary, and then extending the wire from the capillary and thereafter breaking the wire from the ball.

10. The method as claimed in claim 1, wherein the method further comprises:

forming, when the wire clamp is unable to pay out further wire from the capillary to lengthen a wire tail or the wire tail is unsuitable to form a normal ball wire bond, a wire loop comprising a first wire bond and a second wire bond, and breaking the wire from the second wire bond to form a new wire tail of a desired length extending from the capillary.

11. The method as claimed in claim 1, wherein the method further comprises:

forming, when the wire clamp is unable to pay out further wire from the capillary to lengthen a wire tail, a ball wire bond, extending a length of wire between the capillary and the ball wire bond, and then breaking the wire from the ball wire bond to form a new wire tail of a desired length extending from the capillary.

12. Method as claimed in claim 1, wherein the wire holding device comprises a wire clamp.

13. A wire bonding method for forming a wire interconnection including a wedge wire bond, the method comprising the following steps in the sequence set forth:

forming the wedge wire bond on a wire using a capillary;

opening a wire clamp located above a capillary, such that the wire clamp is open and not clamping onto the wire;

lifting the wire clamp and the capillary relative to the wire in a direction away from the wedge wire bond so as to pay out a length of wire from the capillary;

at a predetermined height of the capillary, closing the wire clamp to clamp onto the wire; and thereafter moving the capillary and wire clamp further away from the wedge wire bond to cause the wire to break away from the wedge wire bond so as to form the wire tail with a desired length extending from the capillary;

wherein the method further comprises: producing one or more electrical sparks onto a part of the wire which is stuck on a surface of the capillary to melt the wire which is stuck on the surface of the capillary and detaching the melted wire tail from the surface of the capillary.

* * * * *